(12) United States Patent
Levermore et al.

(10) Patent No.: US 9,293,734 B2
(45) Date of Patent: Mar. 22, 2016

(54) LIGHT EXTRACTION BLOCK WITH CURVED SURFACE

(75) Inventors: Peter Levermore, Lambertville, NJ (US); Emory Krall, Philadelphia, PA (US); Jeffrey Silvernail, Yardley, PA (US); Kamala Rajan, Newtown, PA (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 360 days.

(21) Appl. No.: 12/978,213

(22) Filed: Dec. 23, 2010

(65) Prior Publication Data

US 2012/0161610 A1  Jun. 28, 2012

(51) Int. Cl.
*F21V 5/00*  (2015.01)
*H01L 51/52*  (2006.01)
*H01L 27/32*  (2006.01)

(52) U.S. Cl.
CPC ......... *H01L 51/5275* (2013.01); *H01L 27/3211* (2013.01)

(58) Field of Classification Search
CPC ........................ H01L 51/5275; H01L 27/3211
USPC ............ 313/498–512; 315/169.3; 345/36, 45, 345/76
See application file for complete search history.

(56) References Cited

U.S. PATENT DOCUMENTS

| | | | |
|---|---|---|---|
| 5,836,676 A * | 11/1998 | Ando et al. | 362/244 |
| 6,952,079 B2 | 10/2005 | Shiang et al. | |
| 2010/0308359 A1 | 12/2010 | Singh et al. | |
| 2011/0031514 A1 | 2/2011 | Sakaguchi et al. | |

FOREIGN PATENT DOCUMENTS

| | | |
|---|---|---|
| EP | 1860471 | 11/2007 |
| JP | 9171892 | 6/1997 |
| WO | WO 01/33598 | 5/2001 |
| WO | WO 2010/122781 | 10/2010 |

OTHER PUBLICATIONS

The International Search Report corresponding to the PCT/US2011/066459 application.

(Continued)

*Primary Examiner* — Nimeshkumar Patel
*Assistant Examiner* — Christopher Raabe
(74) *Attorney, Agent, or Firm* — Morris & Kamlay LLP

(57) ABSTRACT

Light extraction blocks, and OLED lighting panels using light extraction blocks, are described, in which the light extraction blocks include various curved shapes that provide improved light extraction properties compared to parallel emissive surface, and a thinner form factor and better light extraction than a hemisphere. Lighting systems described herein may include a light source with an OLED panel. A light extraction block with a three-dimensional light emitting surface may be optically coupled to the light source. The three-dimensional light emitting surface of the block may includes a substantially curved surface, with further characteristics related to the curvature of the surface at given points. A first radius of curvature corresponding to a maximum principal curvature $k_1$ at a point p on the substantially curved surface may be greater than a maximum height of the light extraction block. A maximum height of the light extraction block may be less than 50% of a maximum width of the light extraction block. Surfaces with cross sections made up of line segments and inflection points may also be fit to approximated curves for calculating the radius of curvature.

30 Claims, 14 Drawing Sheets

(56) References Cited

OTHER PUBLICATIONS

Aratani et al., <<Collimated light source using patterned organic-light-emitting diodes and microlens>> Japanese Journal of Applied Physics, Tokyo, Japan, vol. 49, No. 4, Apr. 1, 2010.

The International Search Report and Written Opinion corresponding to the PCT/US2011/066459 application.
D'Andrade et al., Appl. Phys. Lett. 88 192908 (2006).
Levermore et al., OSC, London, UK (Sep. 2009).
Levermore et al., SID 2010, Seattle, USA, May 2010.
Reineke et al., Nature 459, 234 (2009).

* cited by examiner

FIG. 11

LIGHT EXTRACTION BLOCK WITH CURVED SURFACE

STATEMENT AS TO RIGHTS TO INVENTIONS MADE UNDER FEDERALLY SPONSORED RESEARCH OR DEVELOPMENT

This invention was made with government support under DE-FC26-08NT01585 awarded by the Department of Energy. The government has certain rights in the invention.

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

An ongoing challenge for the OLED lighting industry is to improve the efficacy of OLED lighting panels through improved light extraction. At the present time, OLED lighting panel efficacy is limited by light loss through waveguiding in the OLED stack. For example, in a typical planar bottom-emission OLED with no additional light extraction fixtures only as little as 20% of the generated photons can escape from the OLED stack and be emitted as useful illumination. The remaining photons are waveguided in the OLED stack.

For example, FIG. 1 depicts a simplified ray diagram of a planar OLED demonstrating light loss through substrate and anode/organic layer waveguiding. In general, only a small fraction of light emitted relatively close to the surface normal ($<\theta_C$) is outcoupled.

As shown in FIG. 1, light generated in an OLED can be classified into three radiative modes: the outcoupled mode, the substrate waveguided mode and the anode/organic waveguided mode. Depending on the angle of emission $\theta$, photons are outcoupled as useful emission, or waveguided into the substrate or anode/organic layers. The only outcoupled modes are those with angle to the surface normal less than the critical angle $\theta_C$, where $\theta_C = \sin^{-1}(n_{air}/n_{org}) \approx 36°$ for $n_{org} = 1.7$. Substrate modes are emitted through the edges of the substrate, whereas anode/organic modes are heavily attenuated by self-absorption, and do not emit through the edge.

Some improvement in light extraction efficiency may be obtained through the use of a light extraction block. The light extraction block may be optically connected to the OLED substrate emissive surface. An example of such an approach is detailed in U.S. Pat. No. 6,952,079 to Shiang et al. (hereinafter "Shiang"). According to Shiang, a "luminaire" with a planar emitting surface may be provided with a recess to receive an OLED device. The luminaire includes sharply angled sides that extend at a relatively shallow acute angle, and are coated with a highly reflective material. Thus, the acutely angled sides and reflective material direct light towards the planar front surface of the luminaire.

An alternative approach is described in D'Andrade & Brown, APL (2006) (hereinafter "D'Andrade"), which describes an OLED device with a truncated square-pyramid luminaire.

Although the above techniques have proven to be somewhat more effective in terms of light extraction enhancement, they still suffer from a number of shortfalls that limit their efficiency and utility. For example, configurations such as Shiang and D'Andrade do not have optimized geometry for maximum light extraction efficiency or for spreading light away from the surface normal. In this regard, Shiang is limited to an illumination from the front surface that lies parallel to the rear surface, and does not enhance any illumination away from the front surface normal. D'Andrade also suffers from drawbacks in terms of uniform emission intensity and color with viewing angle, and exhibits a strong color shift with viewing angle, depending on which surface light is emitted from.

For a point source, the optimized geometry for minimizing total internal reflection is a hemisphere, as described in Reineke et al. Nature, vol. 459, pg. 234 (2009), and shown in FIG. 2. Using this approach, for a point source all light rays are approximately normal to the surface, and so can be emitted without internal reflection. This approach, however, has its own drawbacks related to relative volume required for the half sphere, and, in particular, is less effective for large area light sources than it is for point sources.

In view of the foregoing, there are continuing needs for improved means for improving the efficiency and utility of OLED light sources, including, for example, means for providing improved light extraction enhancement, as well as spreading light away from the surface normal of OLED light sources and the like.

BRIEF SUMMARY OF THE INVENTION

As mentioned above, it has been found that configurations such as discussed in Reineke et al. Nature, (2009), and shown in FIG. 2, are less effective for large area light sources than for point sources. One reason for this that has been found is that, unless the volume of the hemisphere is increased in proportion to the area of the light source, a significant percentage of light emitted near the edge of the large area light source will suffer total internal reflection. The inventors of the present subject matter have found that, for large area light sources, a light extraction block with, for example, an oblate hemispherical curved emissive surface delivers greater light extraction that an equal volume light extraction block with a parallel emissive surface. The inventors have also surprisingly demonstrated greater light extraction than for an equivalent hemispherical light extraction block with equal major axis.

Thus, aspects of the present invention provide for improvements in light extraction efficiency based on configurations that, for example, allow for a greater proportion of the light incident on the emissive surface to be at an angle less than the critical angle. It has been found that these, and other objects may be achieved by configuring light extraction blocks of differing shapes including various curved surfaces, and other shapes that approximate curved surfaces, that include a relatively thin form factor. Systems and methods described herein may also be used to, for example, improve illumination away from a surface normal of the OLED light source, and the like.

According to embodiments, lighting panels may be provided with a light source including an OLED panel. A light extraction block may be optically coupled to the light source and may include at least one three-dimensional light emitting surface. In embodiments, the at least one three-dimensional light emitting surface may include a substantially curved surface. In embodiments, a first radius of curvature corresponding to a maximum principal curvature $k_1$ at a point p on the at least one substantially curved surface may be greater than a maximum height of the light extraction block. In embodiments, the first radius of curvature may be, for example, greater than 150%, 200% or 300% of the maximum height of the light extraction block.

In embodiments, the substantially curved surface may include a cross section with at least one two-dimensional curve. The substantially curved surface may also include a negative radius of curvature relative to the OLED panel.

In embodiments, the substantially curved surface may include a cross section comprising a plurality of substantially straight lines and at least three inflection points, and the first radius of curvature is calculated with respect to an estimated curve based on the inflection points. In embodiments, the at least three inflection points may have internal angles greater than, for example, 90 or 120 degrees.

According to embodiments, the light source may be substantially flush with, or at least partially inset within, the light extraction block.

According to embodiments, a three-dimensional light emitting surface of the light extraction block may encompass a majority of a total light emitting surface of the light extraction block, and points throughout the three-dimensional light emitting surface may include a radius of curvature greater than or equal to the first radius of curvature.

According to embodiments, a height of the light extraction block may be between 3 mm and 75 mm. In other embodiments, a height of the light extraction block may preferably be, for example, approximately 10 mm, approximately 20 mm, and/or sized based on a cross-sectional width of the lighting panel, e.g. less than one third of a cross-sectional width of the lighting panel.

In embodiments the at least one substantially curved surface may include a second radius of curvature corresponding to a minimum principal curvature $k_2$ at the point p that is greater than the maximum height of the light extraction block. In embodiments, the second radius of curvature may be, for example, greater than 150%, 200% or 300% of the maximum height of the light extraction block.

In embodiments the at least one three-dimensional light emitting surface may include a developable surface.

According to embodiments, the light extraction block may be index matched with a light emitting surface of the light source. The index matching may include, for example, an index matching material between the light extraction block and the light emitting surface of the light source. Substantial matching between two refractive indices occurs when the difference between the indices is less than 0.10, and preferably less than 0.05, 0.02 or 0.01.

According to embodiments, the light extraction block may be formed from at least one of glass, acrylic, polycarbonate, quartz, PMMA, PET and PEN. Other materials could also be used for the light extraction block. For example, in certain circumstances, an OLED light panel may be fabricated on a glass substrate with a high refractive index (e.g. n>1.7). In such instances, the light extraction block may be formed of a high index glass or plastic with similarly high refractive index.

According to embodiments, the OLED panel may include an array of lit and unlit areas and/or an array of multicolored emissive areas.

According other aspects of the invention, lighting panels may be provided with a light extraction block, optically coupled to the light source, including at least one three-dimensional light emitting surface with at least one two-dimensional cross section having a substantially curved segment. In embodiments, a maximum height of the light extraction block may be less than 50% of a maximum width of the light extraction block. In embodiments, the maximum height of the light extraction block may be, for example, less than 33%, or 20%, of a maximum width of the light extraction block.

In embodiments, substantially curved segment may include at least one two-dimension curve. The substantially curved segment may also include a negative radius of curvature relative to the OLED panel.

In embodiments, the substantially curved segment may include a plurality of substantially straight lines and at least three inflection points, and the first radius of curvature is calculated with respect to an estimated curve based on the inflection points. In embodiments, the at least three inflection points may have internal angles greater than, for example, 90 or 120 degrees.

According to embodiments, the light source may be substantially flush with, or at least partially inset within, the light extraction block.

According to embodiments, a height of the light extraction block may be between 3 mm and 75 mm. In other embodiments, a height of the light extraction block may preferably be, for example, approximately 10 mm, approximately 20 mm, and/or sized based on a cross-sectional width of the lighting panel, e.g. less than one third of a cross-sectional width of the lighting panel.

In embodiments the at least one three-dimensional light emitting surface may include a developable surface.

According to embodiments, the light extraction block may be index matched with a light emitting surface of the light source. The index matching may include, for example, an index matching material between the light extraction block and the light emitting surface of the light source. Substantial matching between two refractive indices occurs when the difference between the indices is less than 0.10, and preferably less than 0.05, 0.02 or 0.01.

According to embodiments, the light extraction block may be formed from at least one of glass, acrylic, polycarbonate, quartz, PMMA, PET and PEN. Other materials could also be used for the light extraction block. For example, in certain circumstances, an OLED light panel may be fabricated on a glass substrate with a high refractive index (e.g. n>1.7). In such instances, the light extraction block may be formed of a high index glass or plastic with similarly high refractive index.

According to embodiments, the OLED panel may include an array of lit and unlit areas and/or an array of multicolored emissive areas.

According to yet further aspects of the invention, methods of manufacturing a lighting panel, may include providing light source including an OLED panel and optically coupling a light extraction block including at least one three-dimensional light emitting surface to the light source. In embodiments, the at least one three-dimensional light emitting surface may include a substantially curved surface, and, for example, at least one of (a) a first radius of curvature corresponding to a maximum principal curvature $k_1$ at a point p on the at least one substantially curved surface is greater than a maximum height of the light extraction block, and/or (b) a maximum height of the light extraction block is less than 50% of a maximum width of the light extraction block. Various other methods of manufacturing other lighting panels, with light extraction blocks configured as described herein, are contemplated as within the scope of the invention, and will be appreciated by those of skill in the art upon understanding the exemplary light extraction blocks and related features described herein.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings:

FIGS. 11-12 are iso-candela plots showing the results of testing related art OLED devices.

DETAILED DESCRIPTION OF THE INVENTION

Figure 1:
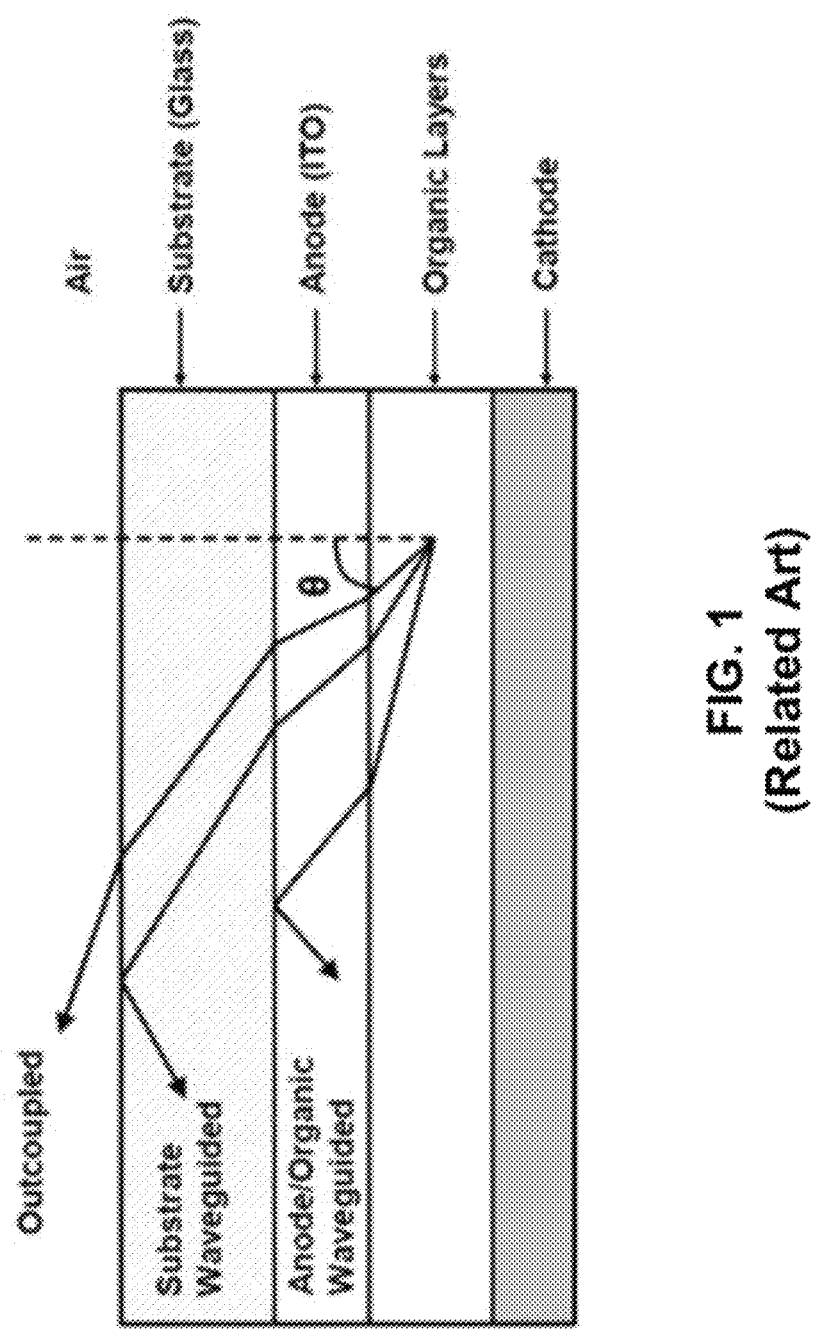
FIG. 1 is a ray diagram of a planar OLED demonstrating light loss through waveguiding.
Figure 2:
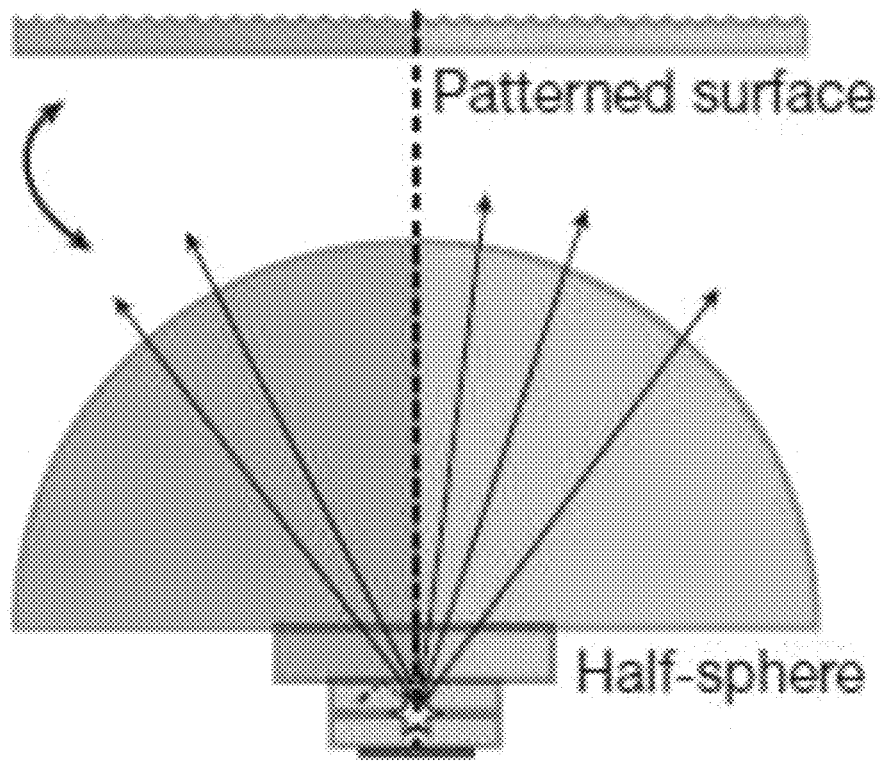
FIG. 2 is a schematic diagram of a related art OLED device structure with a half sphere.

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a surface" is a reference to one or more surfaces and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

As used herein, the radius of curvature, at a given point, is the radius of a circle that mathematically best fits the curve at that point. The principal curvatures at a point p on a curved surface, denoted $k_1$ and $k_2$, are the maximum and minimum values of the curvature. The major principal curvature $k_1$ corresponds to the maximum radius of curvature at a point and the minor principal curvature $k_2$ corresponds to the minimum radius of curvature at the point.

As used herein, unless otherwise limited, a "substantially curved surface" includes three-dimensional surfaces including a cross section with at least one two-dimension curve, and three-dimensional surfaces including a cross section with a plurality of line segments and at least three inflection points that can be used to approximate a curve of the cross section.

As used herein, unless otherwise limited, a "substantially curved segment" includes segments of a cross section with at least one two-dimension curve, and segments of a cross section including a plurality of line segments and at least three inflection points that can be used to approximate a curve of the cross section.

In the case of approximate curves derived from cross sections and segments with at least three inflection points, the principal curvatures $k_1$ and $k_2$, and the corresponding radius of curvature, is applied with respect to an estimated curve based on the plurality of inflection points, and, optionally, end points of the emitting surface, using conventional mathematical techniques. It should also be understood that, consistent with the above described approximations, flat surfaces with zero curvature are not considered to have a measurable radius of curvature. Therefore, when describing relationships that involve a radius of curvature of a curve, or cross sectional segment, compared to a measurable dimension, an infinite radius of curvature, as on a flat line, will not be considered to be "larger than" any particular height, or other measurable, dimension. That is, all radii of curvatures discussed herein are measurable.

As used herein, developable surfaces are those with zero Gaussian curvature, e.g. generalized cylinders, cones, etc., whereas non-developable surfaces include Gaussian curvature, e.g. spheres, spheroids, partial spheroids, three-dimensional saddles, depressions, etc.

According to aspects of the present invention, light extraction blocks with particular curvatures, and approximated curvatures, may be provide, such as for use with an OLED panel, that provide advantages over other techniques known in the art. For example, embodiments of the present invention may include variously shaped light extraction blocks such as those shown in FIG. 3.

Figure 3:
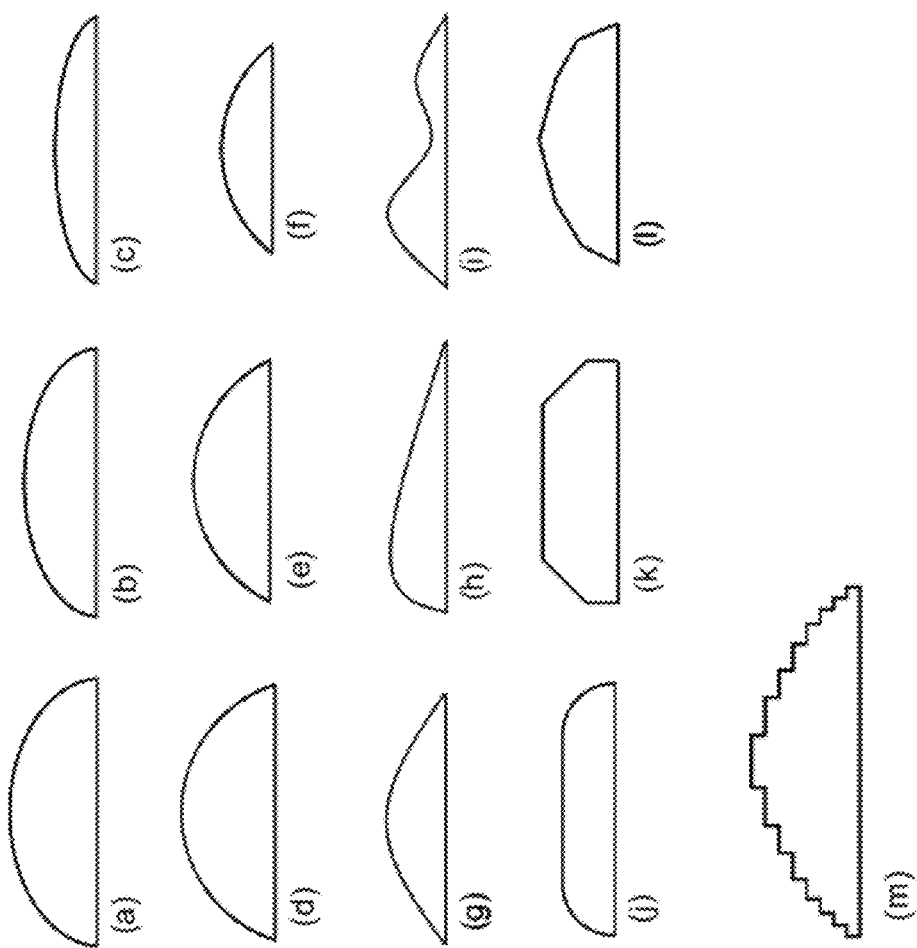
FIG. 3 depicts cross sectional diagrams of various light extraction blocks as may be used in embodiments of the invention.

FIG. 3 includes various cross sectional views of exemplary light extraction blocks according to aspects of the invention. It should be noted that the cross section need not be uniform in shape or dimension throughout the block and/or from different cross sectional angles, e.g. partial cylinders may have different cross sections in different angles, a block may be tapered along the longitudinal axis, etc. As shown in FIG. 3, exemplary configurations may include oblate hemispheres, such as in examples (a-c), segments of a hemisphere, such as in examples (d-f), generic curved surfaces, such as in examples (g-i), curved edges with a flat top, such as in example (j), and blocks with a plurality of planar segments and more than three inflection points, such as in examples (k-m). In embodiments, one or more recesses (not shown) may be included on a back side of the blocks, i.e. the bottom of the blocks as shown in FIG. 3, for receiving light emitting panels. Other depressions and irregular curves, may also be included in the light extraction block, such as in example (i).

It has been found by the inventors that an advantage of various of the proposed curved front surfaces is that it spreads light away from the surface normal. For a standard OLED with a planar front surface, intensity follows Lambert's cosine law. That is to say that intensity observed from the planar surface is directly proportional to the cosine of the angle between the observer's line of sight and the surface normal. This means that at an angle of 60°, intensity is expected to be only approximately ½ of the intensity observed at normal incidence. For various lighting applications it may be advantageous to increase the intensity away from the surface normal. This can readily be achieved using a light extraction block with a curved front surface according to aspects of the invention described herein. An example demonstrating such advantages is described below with reference to FIG. 4.

Figure 4:
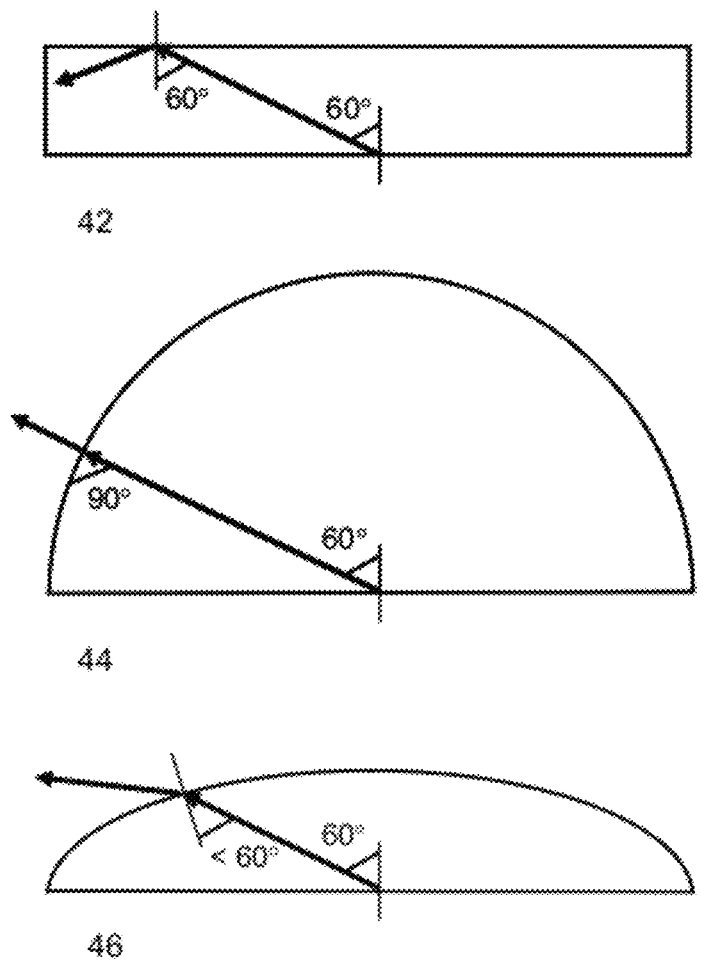
FIG. 4 depicts different ray diagrams according to different cross sectionally shaped light extraction blocks.

As shown in FIG. 4, curved surfaces proposed in this disclosure have been found to be more effective at spreading the light away from the surface normal than either a light extraction block with a parallel emissive surface, as in configuration 42, or a hemispherical light extraction block, as in configuration 44. The block 46, as shown, has a radius of curvature greater than a height of the block, whereas block 44 has a radius of curvature equal to the height of the block, and block 42 shows a cross section that has only flat surfaces with zero curvature, and less than three inflection points.

FIG. 4 shows ray passing through the light extraction block at an angle of 60° to the surface of the substrate, where the block 42 has a parallel emissive surface, block 44 has a hemispherical surface, and block 46 an oblate hemispherical surface. Assuming the light extraction block has a refractive index n=1.5, then the critical angle at which total reflection occurs is given by $\theta_c \approx \sin^{-1}[1/1.5] \approx 41.8°$. For the light extraction block with a parallel emissive surface, there is a high probability that the light ray will suffer total internal reflection. This is shown in block 42. For the light extraction block 44 with a hemispherical surface, the light ray will pass at normal incidence to the surface. It will be extracted from the block, but the angle of the light ray will not change. This is shown with respect to block 44. For the light extraction block with an oblate hemispherical surface, there is a high probability that the light ray will be extracted. However, because of the oblate curvature of the block, there is the additional expected advantage that the light ray is directed away from the surface normal in accordance with Snell's Law. This improves illumination at angles away from the surface normal. This is shown with respect to block 46.

A further advantage of the oblate hemisphere, and other curved blocks according to aspects of the invention, is that for large emissive areas, greater light extraction is enabled over designs such as block 44 and the like. This is because rays emitted from the substrate at an angle close to the surface normal and near to the edge of a hemispherical block will suffer total internal reflection. Equivalent rays can be extracted using an oblate hemispherical block. Further details of an exemplary OLED panel including light extraction blocks as described herein is discussed below beginning with reference to FIG. 5.

Figure 5:
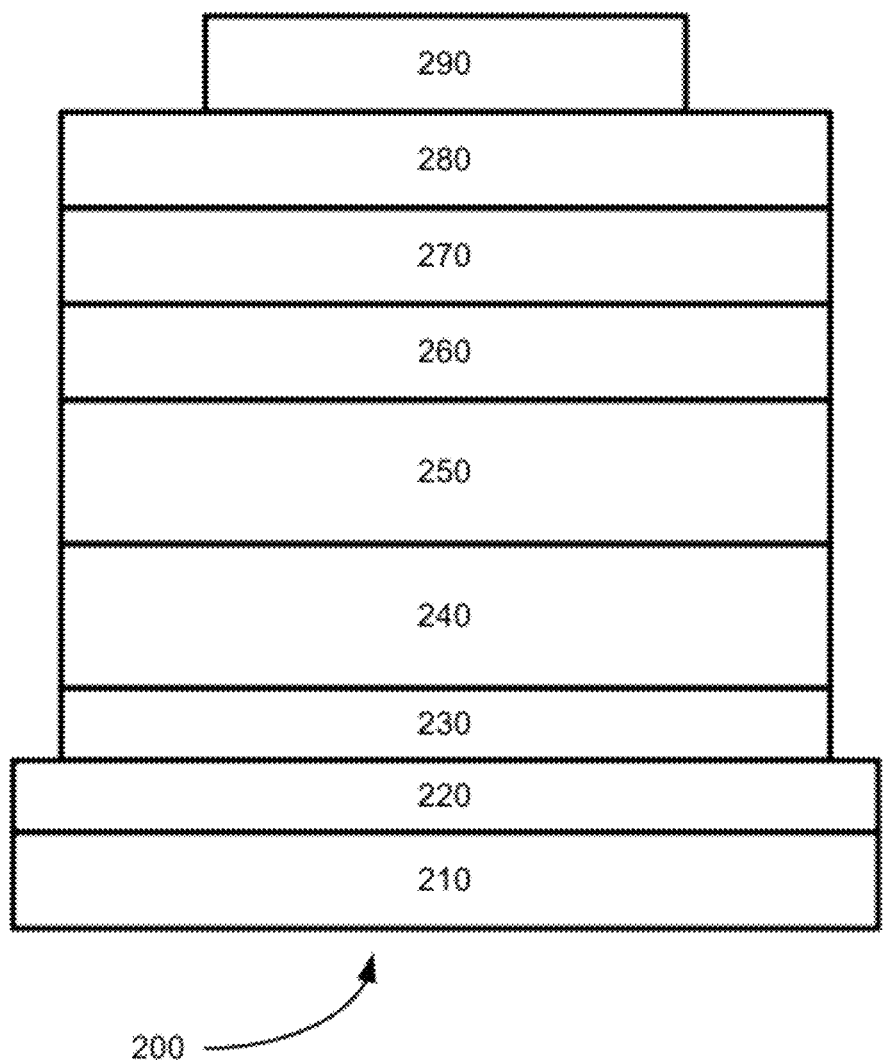
FIG. 5 depicts an exemplary OLED device as may be used in embodiments of the invention.

According to embodiments, lighting panels may be provided with a light source including an OLED panel. As shown in FIG. 5, an exemplary OLED device stack 200 may include a plurality of material layers 210-290. OLEDs may be fabricated on a glass substrate 210, and include, in order, an anode 220 (1200 Å thick ITO), a hole injection layer 230 (100 Å thick LG101, available from LG Chemicals of Korea), a hole transport layer 240 (450 Å thick NPD), a first emissive layer 250 (200 Å thick Host B doped with 30% Green Dopant A and 0.6% Red Dopant A), a second emissive layer 260 (75 Å thick Blue Host A doped with 25% Blue Dopant A), a blocking layer 270 (50 Å thick Blue Host A), a layer 280 (250 Å thick layer of 40% LG201, available from LG Chemicals of Korea and 60% LiQ), and a cathode 290 (10 Å thick layer of LiQ (lithium quinolate) and a 1000 Å thick layer of Al). The foregoing materials and dimensions are provided merely by way of example, and should not be interpreted as limiting the scope of the invention. Other configurations for the OLED are also contemplated and will be appreciated by those of skill in the art.

Some examples of the OLED materials that may be used to form the device stack 200 are shown below.

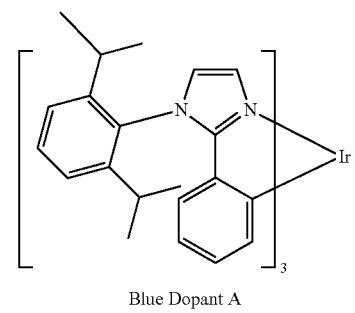

Blue Dopant A

-continued

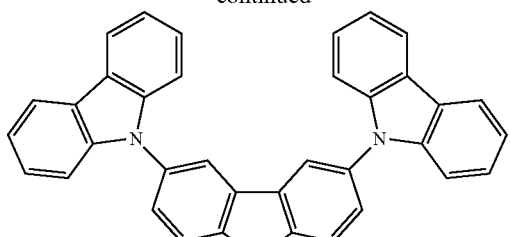

Blue Host A

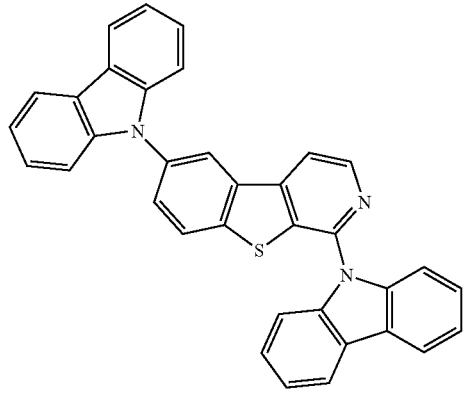

Host B

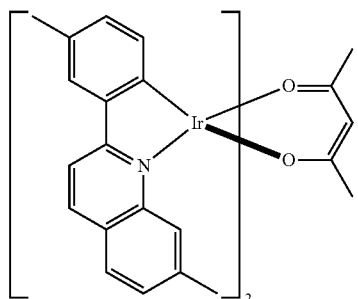

Red Dopant A

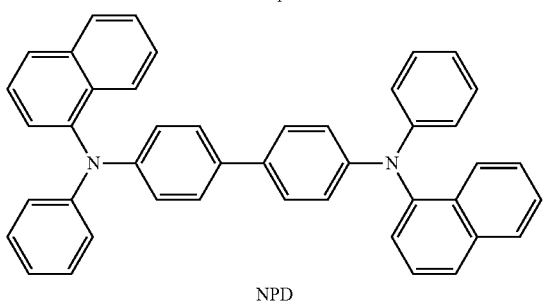

NPD

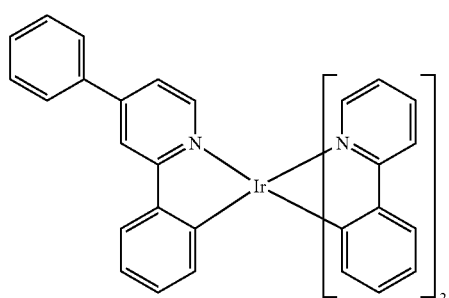

Green Dopant A

An OLED device, such as shown in FIG. 5, may be incorporated in an OLED panel. An active area of the panel may be defined by, for example, a polyimide grid deposited onto the anode prior to VTE deposition. An exemplary active area layout is shown in FIG. 6.

Figure 6:
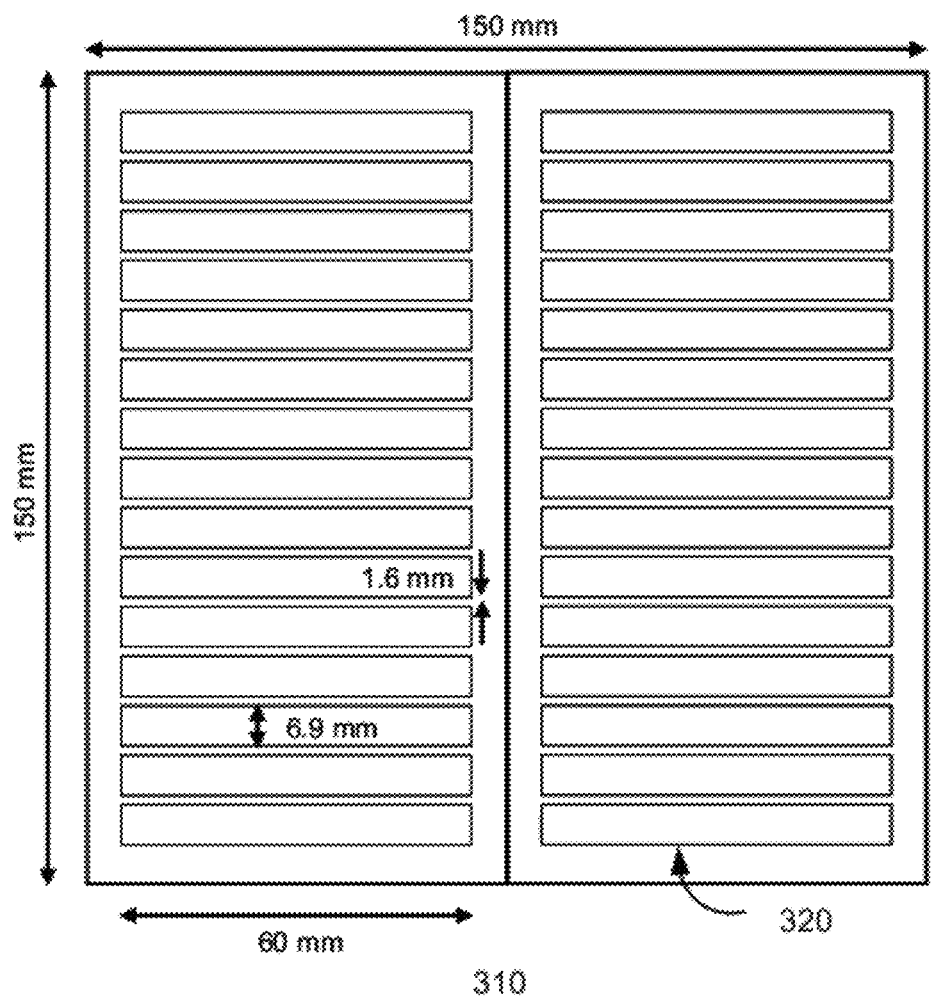
FIG. 6 is a plan view of an exemplary OLED panel according to an embodiment of the invention.

As shown in FIG. 6, an OLED panel may include a plurality of emitting surfaces, which may be configured in various shapes and sizes. The emitting surfaces may include a plurality of multicolor emitters, and/or may be spaced apart from one another by non-emitting regions. In the exemplary panel 310 shown in FIG. 6, thirty emitting stripes 320 are arranged in two rows. Each of the emitting stripes 320, have a length of 60 mm and a width of 6.9 mm, with 1.6 mm spacing between each emitting stripe 320. In embodiments, the emitting stripes 320 may include a plurality of emitting colors, e.g. RGB. The outline of the substrate is 150 mm×150 mm, thus the panel 310 is substantially square shaped. Other shapes and dimensions of the lighting panel, emitting surfaces, and any non-emitting surfaces are also possible.

In embodiments, a lighting panel, such as panel 310, may be optically coupled to a light extraction block. Such optical coupling may include, for example, the light extraction block being index matched with a light emitting surface of the lighting panel, and may include an index matching material between the light extraction block and the light emitting surface of the lighting panel. Substantial matching between two refractive indices occurs when the difference between the indices is less than 0.10, and preferably less than 0.05, 0.02 or 0.01. An exemplary assembly is further described with reference to FIG. 7.

Figure 7:
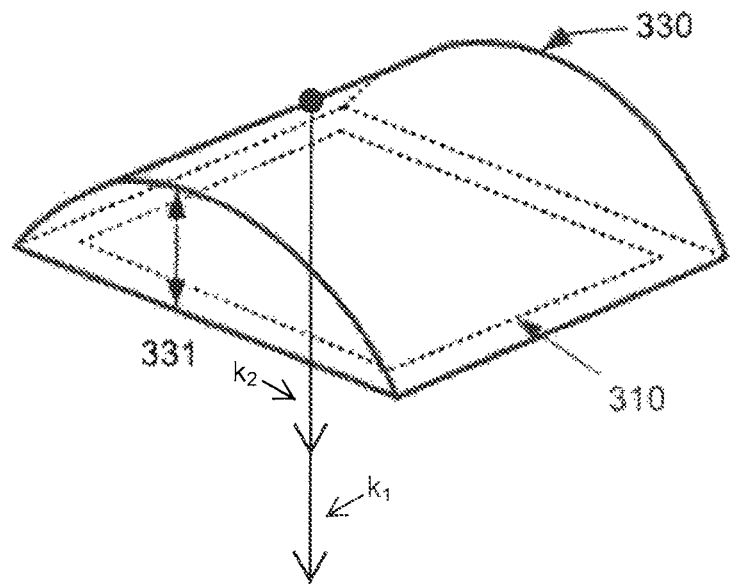
FIG. 7 is an isometric view of an exemplary lighting device and light extraction blocks according to aspects of the invention.
Figure 8:
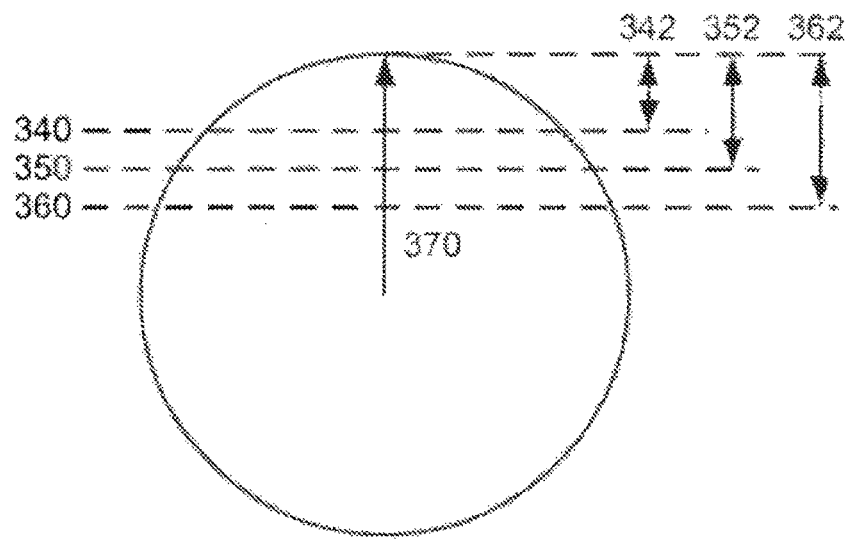
FIG. 8 is an end view of a cylinder used to depict features of exemplary light extraction block shapes according to aspects of the invention.

As shown in FIG. 7, a lighting panel 310 may be optically coupled to a light extraction block 330. The light extraction block 330 may be formed from a partial cylinder and include points along the entire emitting surface having a first principal curvature $k_1$ greater than the maximum height 331 of the block, and a second principle radius of curvature $k_2$. For example, as shown in the er d view depicted in FIG. 8, exemplary light extraction blocks, such as shown in FIG. 7, may include a portion of a cylinder, e.g. as cut along lines 340, 350, or 360, at ⅓, ½, and ⅔ of the radius 370, respectively. Incidentally, the radius 370 of the circle end of the cylinder is equal to the radius of curvature of all points along the circle. Thus, a partial cylinder represented by line 340 would include points throughout the curved segment with a radius of curvature 370 that is 300% of the height 342 of the partial cylinder, i.e. the maximum height of the resulting block would be ⅓ the radius of curvature. Likewise, a partial cylinder represented by line 350 would include points throughout the curved segment with a radius of curvature 370 that is 200% of the height 352 of the partial cylinder, i.e. the maximum height of the resulting block would be ½ the radius of curvature, and a partial cylinder represented by line 360 would include points throughout the curved segment with a radius of curvature 370 that is 150% the height 362 of the partial cylinder, i.e. the maximum height of the resulting block would be ⅔ the radius of curvature.

It should also be noted that similar measurements may be made with respect to light extraction blocks according to aspects of the invention formed from partial spheroids. For example, considering the end view depicted in FIG. 8 as a spherical cross section rather than a cylinder end, partial spheroid extraction blocks with equal maximum and minimum principal curvatures $k_1$ and $k_2$ greater than a maximum height of the light extraction block may be formed.

To measure the effectiveness of a light extraction block such as shown in FIG. 7, an OLED light panel shown in FIG. 6 (which has the white OLED stack shown in FIG. 5) was measured inside a 20" integrating sphere equipped with an Ocean Optics spectrometer. The integrating sphere collects all light emitted from the OLED light panel across all viewing angles. Two measurements were made: (a) OLED light panel on its own with no light extraction block, and (b) OLED light panel where the light panel is index matched to a light extraction block such as shown in FIG. 7. In each case, the current and voltage required to deliver approximately 1000 cd/m² active area luminance was measured. Current, voltage and light output were then used to calculate power efficacy with and without the light extraction block and therefore to calculate light extraction efficacy enhancement provided by the block. The results were as follows: (a) without the block: power efficacy=33.6 lm/W, and (b) with the block: power efficacy=42.2 lm/W. The light extraction block therefore provides 1.26× efficacy enhancement in this instance.

Figure 9A:
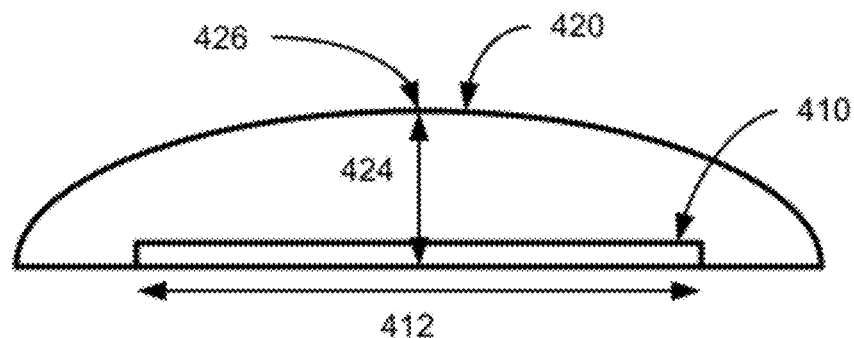
FIG. 9A depicts a cross sectional view of an exemplary OLED panel with a light extraction block according to aspects of the invention.
Figure 9B:
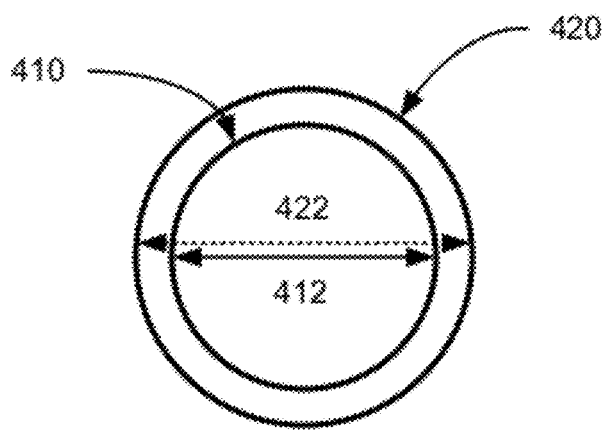
FIG. 9B is a plan view of the exemplary OLED panel shown in FIG. 9A.
Figure 10:
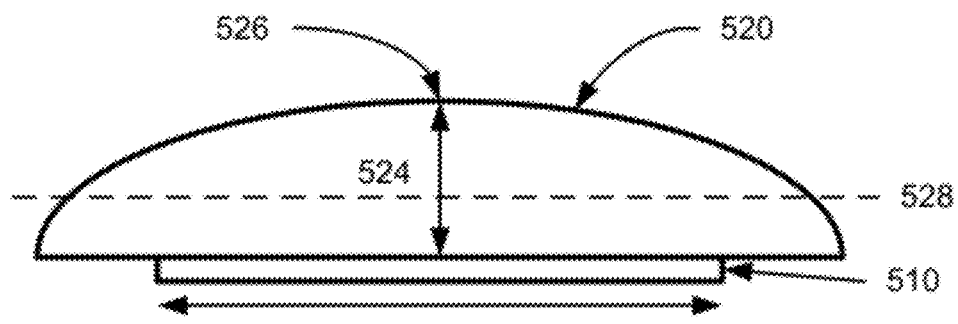
FIG. 10 depicts a cross sectional view of another exemplary OLED panel with a light extraction block according to aspects of the invention.

Examples of yet further embodiments including a lighting panel optically coupled to a light extraction block are shown in FIGS. 9-10, and result of testing conducted using similar blocks and assemblies is discussed below with reference to Table 1 below.

As shown in the cross sectional view of FIG. 9A, a lighting panel 410, may be optically coupled to a light extraction block 420. Light extraction block 420 may be configured, for example, as an oblate hemisphere (i.e. an ellipse rotated about the minor axis). As shown in the plan view of FIG. 9B, the light extraction block 420 has a circular circumference with diameter 422, e.g. 150 mm. The substrate holding the lighting panel 410 is inset into the block 420, as shown in FIG. 9A. The substrate in this instance is a circular disk with diameter 412, e.g. 120 mm. The thickness, or height, 424 of the light extraction block 420 is greatest at the center of the disk, e.g. less than 75 mm, or, less than 25 mm, or approximately 15 mm. Thus, the light extraction block 420 includes a cross section with a curved segment, and includes a height less than ½ the diameter 422, or maximum width, of the light extraction block 420.

Additionally, a point 426 at the apex of the block 420, has a radius of curvature that is greater than the height 424 of the block. Preferably, the radius of curvature at 426 may be greater than 150%, 200% or 300%, of the maximum height of the light extraction block. In the case of oblate hemispheres, such as shown in FIG. 9A, the major principal curvature $k_1$ and the minor principal curvature $k_2$ may be equal. However, in other embodiments, non-spheroid shapes, such as those including partial cylinders, saddles, etc., may be used, in which cases the major principal curvature $k_1$ and the minor principal curvature $k_2$ may be different on particular points of the surface. For purposes of the testing discussed below, the thickness of the light extraction block as shown in FIG. 9A (the minor axis) was varied from 15 mm to 75 mm.

Aspects of an alternative embodiment, also subjected to testing, are depicted with reference to FIG. 10. FIG. 10 shows a light extraction block 520 with a cross section having a thickness 524 of, for example, 25 mm. According to the embodiment depicted in FIG. 10, the lighting panel 510 is not inset into the block 520, but may be index matched to the rear surface, i.e. the bottom surface of block 520 as seen in FIG. 10. Light extraction block 520 may be configured, for example, as an oblate hemisphere (i.e. an ellipse rotated about the minor axis). The plan view may be similar to that of FIG. 9B, including a circular circumference with diameter of approximately 150 mm. The substrate of the lighting panel 510 may be a circular disk with diameter of approximately 120 mm. The thickness, or height, 524 of the light extraction block 520 is greatest at the center of the disk. Thus, the light extraction block 520 includes a cross section with a curved segment, and includes a height 25 mm that is less than ½ the diameter, or maximum width, of the light extraction block 520.

Additionally, a point 526 at the apex of the block 520, as well as other points along the cross sectional curved surface, has a radius of curvature that is greater than the height 524 of the block. Preferably, the radius of curvature at 526 may be greater than 150%, 200% or 300%, of the maximum height of the light extraction block. As also shown in FIG. 10, a majority of the emitting surface of the block 520 may have radii of curvature greater than the height 524. For example, all points along the curved segment of the cross section above dashed line 528, representing a majority of the total emitting surface of the block, may have relatively large radii of curvature.

In order to demonstrate further advantages of aspects of the present subject matter, Trace Pro was used to model light extraction for different shaped light extraction blocks, including those shown in FIGS. 9-10, and other configurations with hemispherical, truncated pyramid and square block devices. Each light source was defined as a blackbody radiator with color temperature=3000 K. Emission pattern at the emissive surface was defined as Lambertian. In each case, substrate thickness=0.7 mm and substrate refractive index n=1.5 with 100% transmittance. The light extraction blocks also have refractive index n=1.5 with 100% transmittance. The emissive area covers the entire substrate with equal brightness at all points on the surface. Reflectance of the emissive surface=80%. Light absorption in the organic device stack is neglected.

Results of the optical modeling performed with models similar to those represented in FIGS. 9-10, and comparisons with other hemispherical, truncated pyramid and square block devices, are shown in Table 1.

TABLE 1

| Block Shape | Height [mm] | Volume [cm³] | Substrate Size [mm] | Fill Factor [%] | Angle for Half Luminance | Efficiency [%] |
|---|---|---|---|---|---|---|
| Curved Block | 15 | 176.7 | 120 diameter | 64% | 74° | 89.4% |
| Curved Block | 23.3 | 274.5 | 120 diameter | 64% | 76° | 92.0% |
| Curved Block | 25 | 294.5 | 120 diameter | 64% | 76° | 93.5% |
| Curved Block | 50 | 589.1 | 120 diameter | 64% | 72° | 95.9% |
| Curved Block | 60 | 706.9 | 120 diameter | 64% | 72° | 94.9% |
| Hemisphere | 75 | 883.6 | 120 diameter | 64% | 69° | 86.2% |
| Curved Block (No Inset) | 25 | 294.5 | 120 diameter | 64% | — | 92.6% |
| Inverted Truncated Pyramid | 15 | 274.5 | 120 × 120 square | 64% | 61° | 90.8% |
| Square Block | 12.2 | 274.5 | 120 × 120 square | 64% | 60° | 70.6% |

For each light extraction block in Table 1, height and volume are given. Fill factor is defined as the area of the emissive surface (which is equal to the substrate area in this model)

divided by the cross-sectional area of the light extraction block. This is a constant=64.0%. Efficiency is defined as the percentage of rays entering the light extraction block that are then emitted from the block. This is a measure of the effectiveness of each light extraction block.

It can be seen that for the oblate hemisphere block with the inset substrate shown in Table 1, there is efficient light extraction in all cases. As the height of the block (the minor axis of the oblate hemisphere) is increased from 15 mm to 50 mm, light extraction increases from 89.4% to 95.9%. This can be explained in terms of reduced cathode reflections as light passes through a thicker block. However, if the thickness of the block is increased further from 50 mm to 75 mm, light extraction decreases from 95.9% to 86.2%. This can be explained in terms of the steeper side walls, which internally reflect light emitted at close to normal incidence near to the side walls. This modeling data demonstrates that an oblate hemisphere is significantly more effective at extracting light from a large area substrate that a hemisphere with the same major axis.

As mentioned above, FIG. 10 shows an oblate hemisphere block with height 524 of 25 mm, where the substrate is not inset into the block. The substrate is instead index matched to the rear surface of the light extraction block. It can be seen from Table 1, that the light extraction block with the inset has efficiency=93.5%, while a block also of height=25 mm, where the substrate is not inset into the block has efficiency=92.6%. The slight fall off in efficiency arises because less substrate waveguided light is collected, though both configurations may be viable according to aspects of the invention.

Table 1 also includes comparisons with an inverted truncated pyramid light extraction block and a rectangular cuboid light extraction block. In the case of the inverted truncated pyramid light extraction block with height=15 mm, light extraction efficiency=90.8%. In order to perform a comparison to the oblate hemisphere, light extraction blocks of the same volume were selected. The volume of the inverted truncated pyramid block=274.5 cm$^3$. An oblate hemisphere block of height=23.3 mm has equal volume. The oblate hemisphere block of volume=274.5 cm$^3$ has light extraction efficiency=92.0%. This is 1.2% higher than for the equivalent volume inverted truncated pyramid. With the rectangular cuboid light extraction block with height=13.3 mm, and volume=274.5 cm$^3$, light extraction efficiency is only 70.6%, which is substantially less than the oblate hemisphere block of equivalent volume.

One of the disadvantages of using a parallel front surface is that the emission profile is essentially Lambertian. This means that intensity falls off with angle away from the surface normal according to Lambert's cosine law, so that the OLED provides poor illumination away from the surface normal. An advantage of the oblate hemisphere light extraction block, and other shapes according to aspects of the invention, is that it improves illumination at angles away from the surface normal, as mentioned with respect to FIG. 4. The results of further testing supporting this finding is shown in FIGS. 11-14.

In order to demonstrate this improved illumination at wide angles, Trace Pro modeling was used for light extraction blocks as shown in FIGS. 9-10, and compared to other configurations with hemispherical, truncated pyramid, and square blocks.

Figure 11:
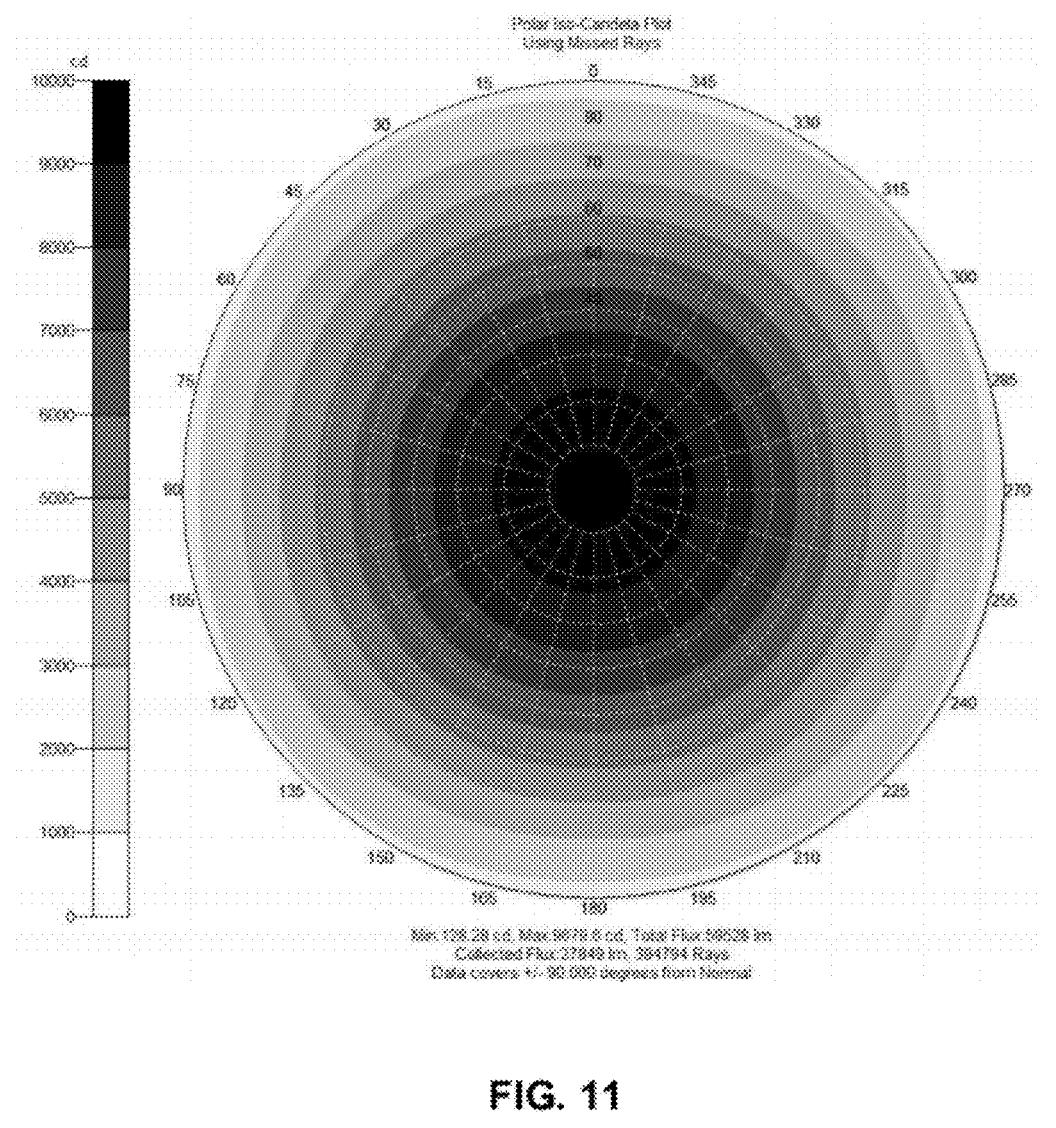
Figure 12:
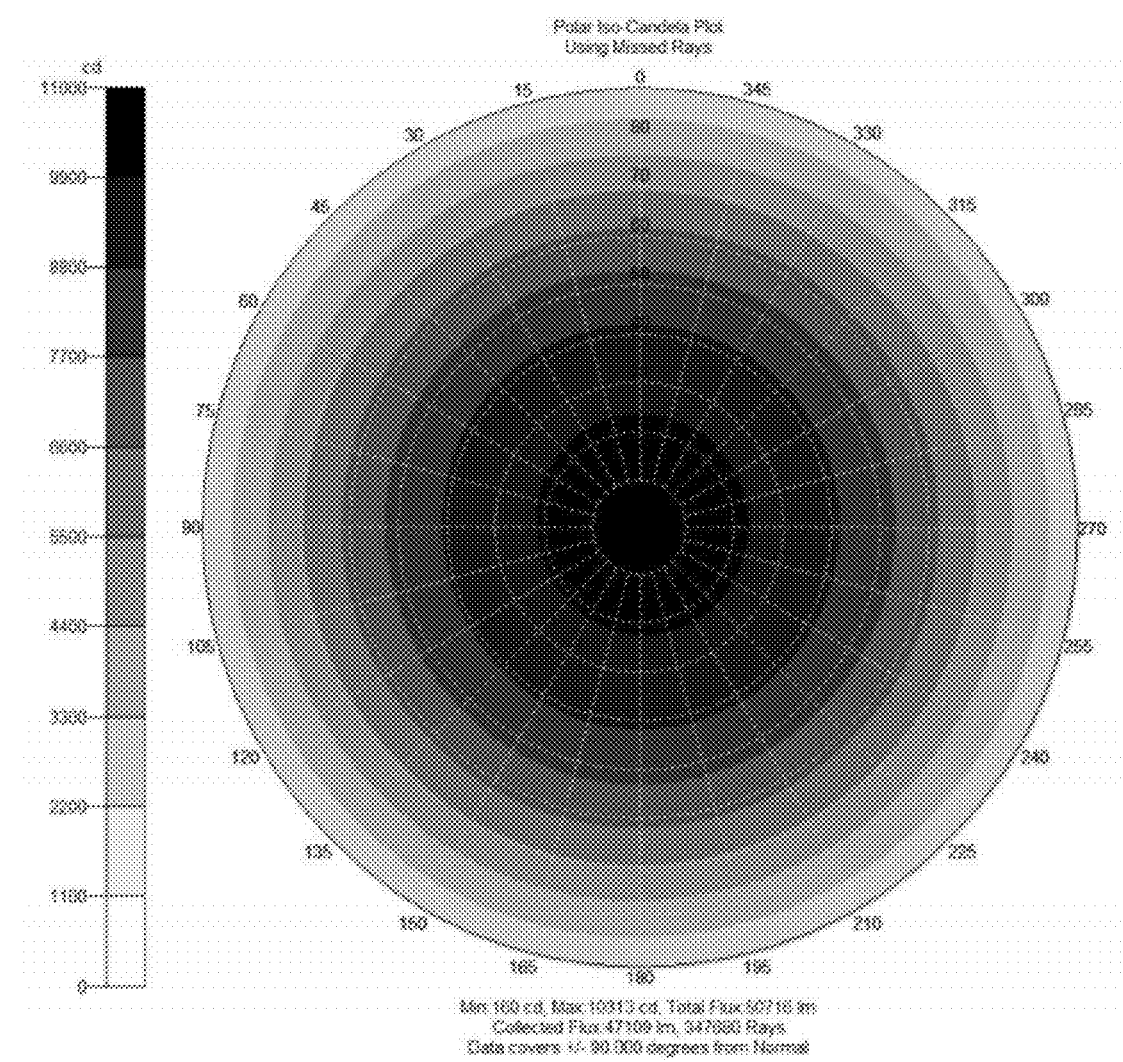

FIGS. 11-14 show iso-candela plots of light rays escaping the tested light extraction block. In each case, 100,000 input rays were used for the model. FIG. 11 shows results using an inverted truncated pyramid block. The block height=15 mm, with volume=274.5 cm$^3$ and light extraction efficiency=90.8%. Here, luminance drops to 50% of the value at normal incidence at 61° from the surface normal. FIG. 12 shows results using a hemispherical block. The block height=75 mm, with volume=883.6 cm$^3$ and light extraction efficiency=86.2%. Here, luminance drops to 50% of the value at normal incidence at 69° from the surface normal.

Figure 13:
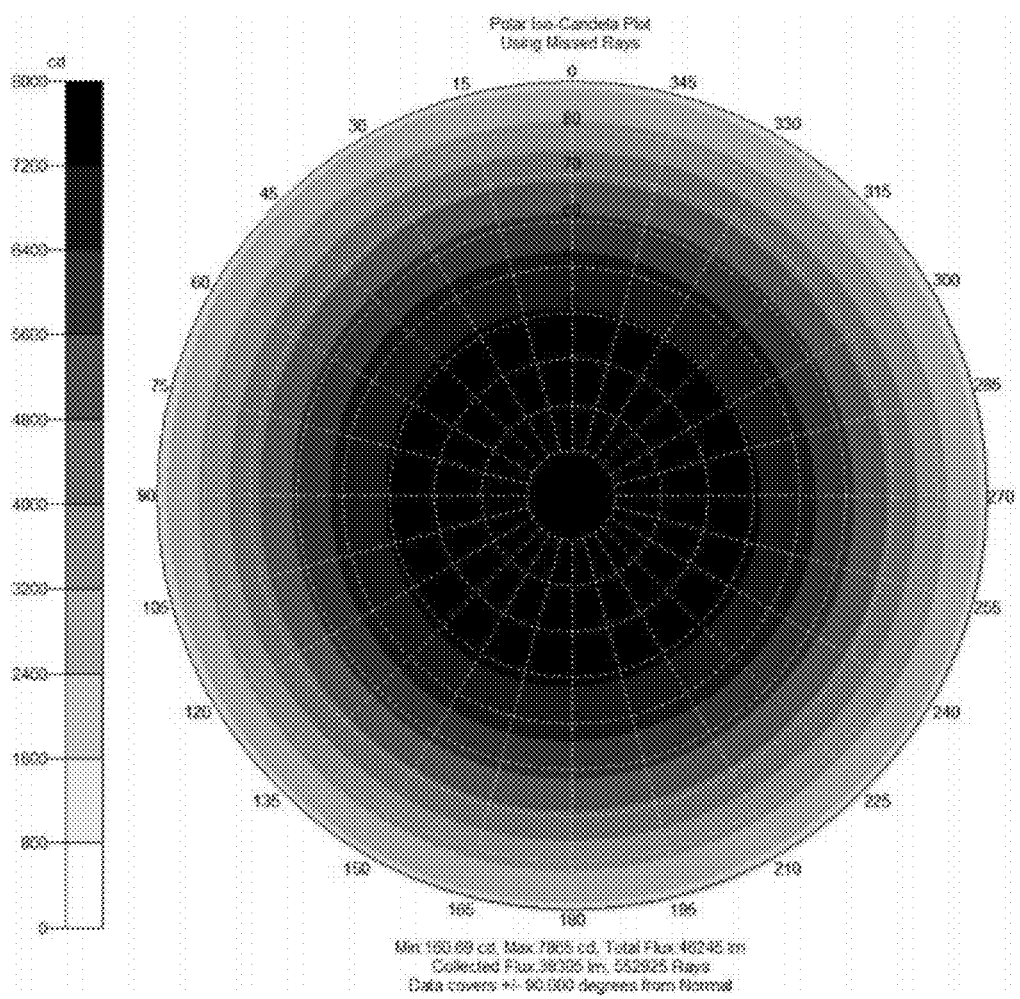
FIGS. 13-14 are iso-candela plots showing the results of testing OLED devices configured according to aspects of the invention.
Figure 14:
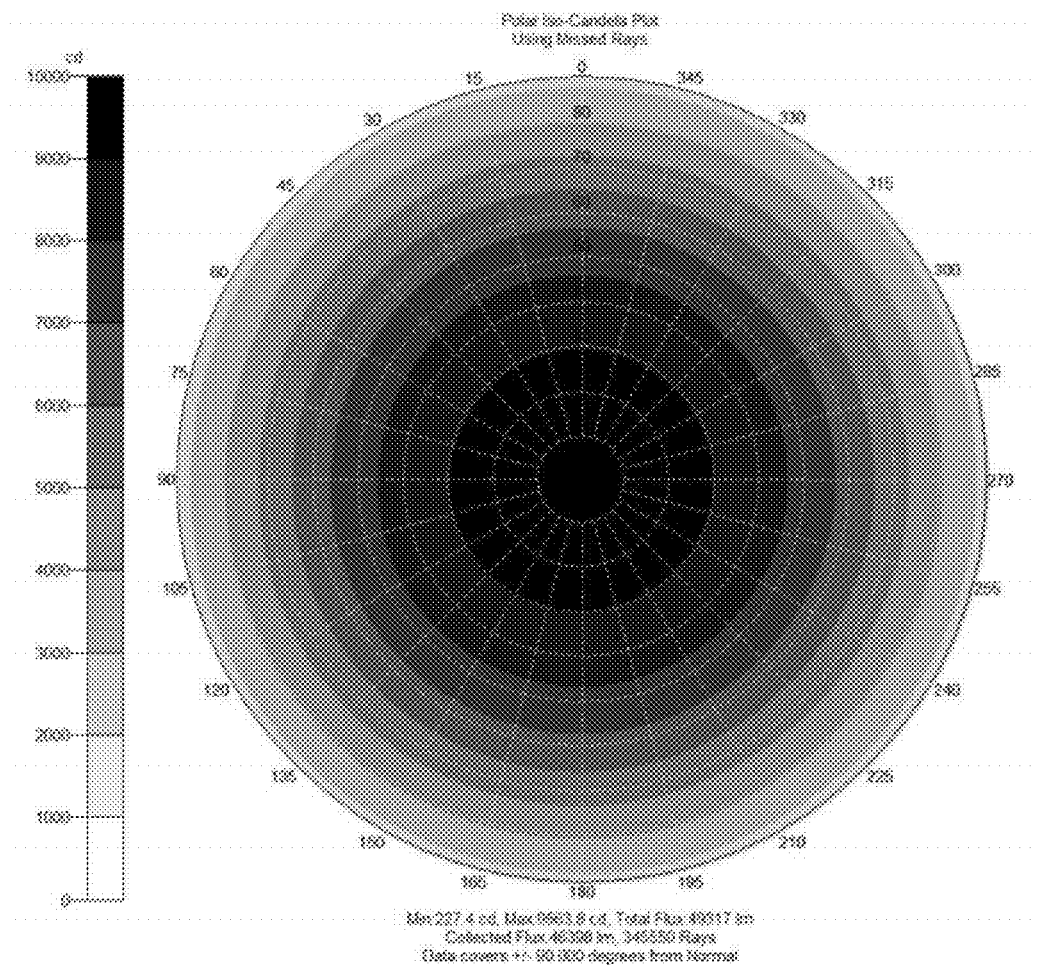

FIG. 13 represents results of testing including an oblate hemispherical block with height of 23.3 mm and a volume of 274.5 cm$^3$. FIG. 14 represents results of testing including an oblate hemispherical block with height of 50.0 mm and volume of 589.1 cm$^3$. As previously shown in Table 1, luminance drops to 50% of the value at normal incidence at angles of 76° and 72° from the surface normal for the blocks of height=23.3 mm and 50 mm, respectively. This demonstrates that oblate hemispherical blocks are more effective at spreading light away from the surface normal than either blocks with parallel front and rear surfaces or hemispherical blocks. Additional data is included in Table 1 for blocks of height=15 mm and 60 mm, and for a rectangular cuboid block.

Although tests described above were conducted with light extraction blocks configured as oblate spheroids, principles of the invention are applicable to a range of shapes, dimensions and configurations, such as shapes including relatively shallow curves and approximated curves. For example, additional exemplary configurations with curved and approximated curved emitting surfaces are shown in FIGS. 15-18.

Figure 15:
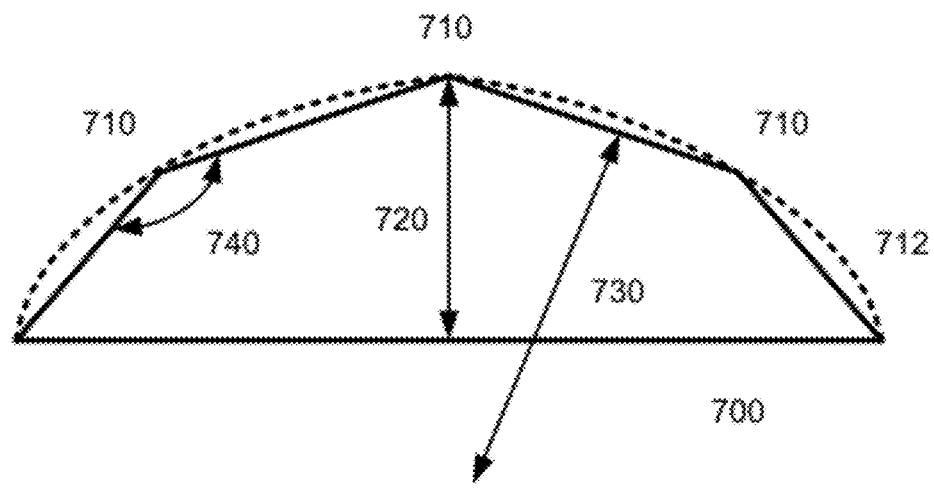
FIG. 15 depicts a cross sectional view of an exemplary light extraction block according to aspects of the invention having a substantially curved surface made up of a plurality of segments and at least three inflection points.

As mentioned previously, in the case of approximate curves derived from cross sections and segments with at least three inflection points, the principal curvatures $k_1$ and $k_2$, and the corresponding radius of curvature, is applied with respect to an estimated curve based on the plurality of inflection points, and, optionally, end points of the emitting surface, using conventional mathematical techniques. A first example of such measurement is shown in FIG. 15, in which a cross section of block 700 may include a plurality of line segments and at least three inflection points 710. An approximated curve 712 may be derived using standard mathematical techniques based on, for example, the inflection points 710. Accordingly, a radius of curvature 730 may be calculated for a point on the approximated curve 712, which may be larger than a maximum block, or cross sectional, height 720. The internal angles of the inflection points 710 of the cross section, such as internal angle 740, may be greater than 90°, and, as shown in FIG. 15, may be larger than 120°.

Figure 16:
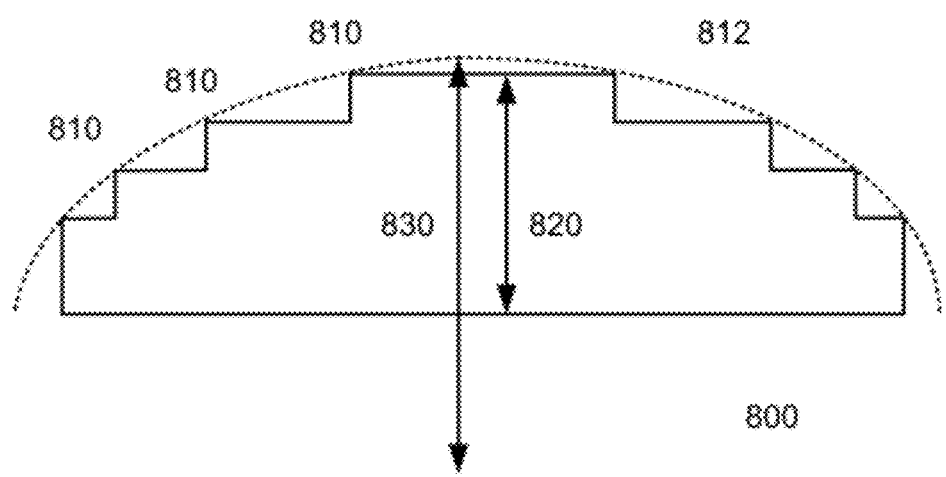
FIG. 16 depicts a cross sectional view of another exemplary light extraction block according to aspects of the invention having a substantially curved surface made up of a plurality of segments and at least three inflection points.

A second example of similar measurements is shown in FIG. 16, in which a cross section of block 800 may include a plurality of line segments and more than three inflection points 810. As with block 700, an approximated curve 812 may be derived using standard mathematical techniques based on, for example, the inflection points 810. Accordingly, a radius of curvature 830 may be calculated for a point on the approximated curve 812, which may be larger than a maximum block, or cross sectional, height 820. In such circumstances, the internal angles of the inflection points 810 of the cross section, need not be greater than 90°, to form a substantially curved surface as described herein. In fact, as will be appreciated by observing the configuration shown in FIG. 16, one or more of the inflection points 810 may include internal angles less than 90° and still achieve an overall substantially curved surface based on the inflection points.

Figure 17:
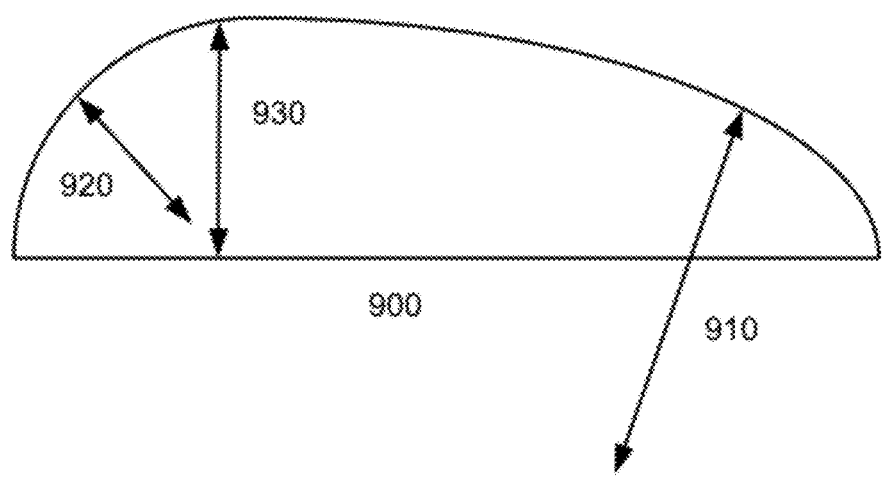
FIG. 17 depicts a cross sectional view of another exemplary light extraction block according to aspects of the invention having an irregularly curved surface.

An example of a block 900 including an irregularly curved cross section is shown in FIG. 17. As shown in FIG. 17, a block 900 may include any number of curvatures and a number of different radii of curvature such as 910 and 920. Taking into account the irregular configuration of the curved surface of the cross section, radius of curvature 910 may be greater than the maximum block height 930, thus satisfying aspects of the invention. Although radius of curvature 920 may be less than the maximum block height 930, the block 900 may still benefit from the advantages of the relatively shallow curve in the vicinity of radius of curvature 910, and may even provide desirable effects in situations where directivity or other influences on the lighting source are intended. That is, according to aspects of the invention described herein, it is not necessary that all radii of curvature be, for example, greater than the maximum block height.

Figure 18:
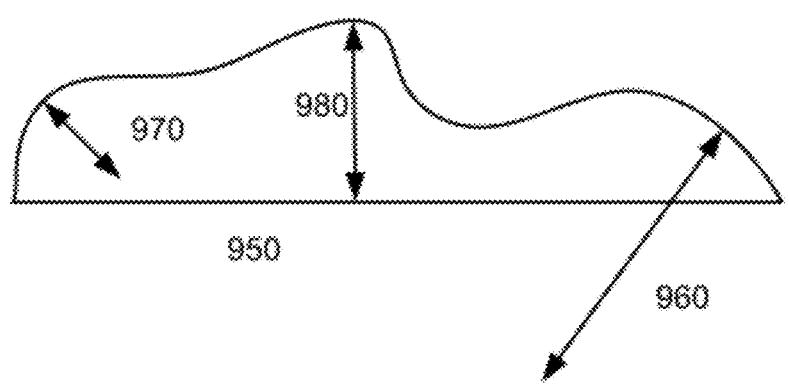
FIG. 18 depicts a cross sectional view of yet another exemplary light extraction block according to aspects of the invention having an irregularly curved surface.

A further example of a block 950 including an even more irregularly curved cross section is shown in FIG. 18. As shown in FIG. 18, a block 950 may include any number of curvatures and a number of different radii of curvature such as 960 and 970. Taking into account the irregular configuration of the curved surface of the cross section, radius of curvature 960 may be greater than the maximum block height 980, thus satisfying aspects of the invention.

Other aspects of the invention may include methods of manufacturing light extraction blocks, and lighting panels including such light extraction blocks. For example, methods of manufacturing lighting blocks as described herein may include providing a light extraction block with the described properties, such as, for example, a first radius of curvature corresponding to a maximum principal curvature $k_1$ at a point p on the at least one substantially curved surface is greater than a maximum height of the light extraction block, and/or a maximum height of the light extraction block is less than 50% of a maximum width of the light extraction block. Additionally, methods of manufacturing OLED lighting panels with lighting blocks as described herein may include providing a light source including an OLED panel and optically coupling a light extraction block including at least one three-dimensional light emitting surface to the light source. In embodiments, the at least one three-dimensional light emitting surface includes a substantially curved surface, with features such as those described throughout the disclosure, and as will be appreciated by those of skill in the art upon understanding the concepts herein.

The description given above is merely illustrative and is not meant to be an exhaustive list of all possible embodiments, applications or modifications of the invention. Thus, various modifications and variations of the described methods and systems of the invention will be apparent to those skilled in the art without departing from the scope and spirit of the invention. Although the invention has been described in connection with specific embodiments, it should be understood that the invention as claimed should not be unduly limited to such specific embodiments.

What is claimed is:

1. A lighting panel, comprising:
a light source including an OLED panel;
a light extraction block optically coupled to the light source and including at least one three-dimensional light emitting surface,
wherein, the at least one three-dimensional light emitting surface includes a substantially curved surface;
a first radius of curvature corresponding to a maximum principal curvature k1 at a point p located at the apex of the light extraction block and on the at least one substantially curved surface, wherein the first radius of curvature is greater than a maximum height of the light extraction block;
a second radius of curvature corresponding to a minimum principal curvature k2 at the point p that is different from the first radius of curvature; and
wherein the light extraction block is non-spherical.

2. The lighting panel of claim 1, wherein the first radius of curvature is greater than 150% of the maximum height of the light extraction block.

3. The lighting panel of claim 1, wherein the first radius of curvature is greater than 200% of the maximum height of the light extraction block.

4. The lighting panel of claim 1, wherein the first radius of curvature is greater than 300% of the maximum height of the light extraction block.

5. The lighting panel of claim 1, wherein:
the at least one three-dimensional light emitting surface comprises a majority of a total light emitting surface of the light extraction block, and
points throughout the at least one three-dimensional light emitting surface include a radius of curvature greater than or equal to the first radius of curvature.

6. The lighting panel of claim 1, a wherein the second radius of curvature is greater than the maximum height of the light extraction block.

7. The lighting panel of claim 1, wherein the second radius of curvature is greater than 150% of the maximum height of the light extraction block.

8. The lighting panel of claim 1, wherein the second radius of curvature is greater than 200% of the maximum height of the light extraction block.

9. The lighting panel of claim 1, wherein the second radius of curvature is greater than 300% of the maximum height of the light extraction block.

10. The lighting panel of claim 1, wherein the substantially curved surface includes a cross section with at least one two-dimensional curve.

11. The lighting panel of claim 1, wherein the substantially curved surface includes a cross section comprising a plurality of substantially straight lines and at least three inflection points, and the first radius of curvature is calculated with respect to an estimated curve based on the inflection points.

12. The lighting panel of claim 11, wherein the at least three inflection points have internal angles greater than 90 degrees.

13. The lighting panel of claim 11, wherein the at least three inflection points have internal angles greater than 120 degrees.

14. A lighting panel comprising:
a light source including an OLED panel;
a light extraction block optically coupled to the light source and including at least one three-dimensional light emitting surface,
wherein, the at least one three-dimensional light emitting surface includes a substantially curved surface;
a first radius of curvature corresponding to a maximum principal curvature k1 at a point p located at the apex of the light extraction block and on the at least one substantially curved surface, wherein the first radius of curvature is greater than a maximum height of the light extraction block;
a second radius of curvature corresponding to a minimum principal curvature k2 at the point p that is different from the first radius of curvature;
wherein the at least one three-dimensional light emitting surface includes a developable surface; and
wherein the light extraction block is non-spherical.

15. The lighting panel of claim 1, wherein the substantially curved surface further comprises a negative radius of curvature relative to the OLED panel.

16. The lighting panel of claim 1, wherein the OLED panel comprises an array of lit and unlit areas.

17. The lighting panel of claim 1, wherein the OLED panel comprises an array of multicolored emissive areas.

18. A lighting panel, comprising:
a light source including an OLED panel;
a light extraction block optically coupled to the light source and including at least one three-dimensional light emitting surface,
wherein, the at least one three-dimensional light emitting surface includes at least one two-dimensional cross section with a substantially curved segment used to approximate at least one substantially curved surface,
wherein, a maximum height of the light extraction block is less than 50% of a maximum width of the light extraction block;
a first radius of curvature corresponding to a maximum principal curvature k1 at a point p located at the apex of the light extraction block and on the at least one substantially curved surface, wherein the first radius of curvature is greater than the maximum height of the light extraction block; and
a second radius of curvature corresponding to a minimum principal curvature k2 at the point p that is different from the first radius of curvature; and
wherein the light extraction block is non-spherical.

19. The lighting panel of claim 18, wherein the maximum height of the light extraction block is less than 33% of a maximum width of the light extraction block.

20. The lighting panel of claim 18, wherein the maximum height of the light extraction block is less than 20% of a maximum width of the light extraction block.

21. The lighting panel of claim 18, wherein the substantially curved segment ent dudes at least one two-dimensional curve.

22. The lighting panel of claim 18, wherein the substantially curved segment comprises a plurality of substantially straight lines and at least three inflection points, and the first radius of curvature is calculated with respect to an estimated curve based on the inflection points.

23. The lighting panel of claim 22, wherein the at least three inflection points have internal angles greater than 90 degrees.

24. The lighting panel of claim 22, wherein the at least three inflection points have internal angles greater than 120 degrees.

25. The lighting panel of claim 18, wherein the at least one three dimensional light emitting surface includes a developable surface.

26. A light extraction block for use with a lighting panel, the light extraction block comprising:
at least one three-dimensional light emitting surface,
wherein, the at least one three-dimensional light emitting surface includes a substantially curved surface;
a first radius of curvature corresponding to a maximum principal curvature k1 at a point p located at the apex of the light extraction block and on the at least one substantially curved surface. wherein the first radius of curvature is greater than a maximum height of the light extraction block;
a second radius of curvature corresponding to a minimum principal curvature k2 at the point p that is different from the first radius of curvature; and
wherein the light extraction block is non-spherical.

27. A light extraction block for use with a lighting panel, the light extraction block comprising:
at least one three-dimensional light emitting surface,
wherein, the at least one three-dimensional light emitting surface includes at least one two-dimensional cross section with a substantially curved segment used to approximate at least one substantially curved surface, and
wherein, a maximum height of the light extraction block is less than 50% of a maximum width of the light extraction block;
a first radius of curvature corresponding to a maximum principal curvature k1 at a point p located at the apex of the light extraction block and on the at least one substantially curved surface, wherein the first radius of curvature is greater than the maximum height of the light extraction block;
a second radius of curvature corresponding to a minimum principal curvature k2 at the point p that is different from the first radius of curvature; and
wherein the light extraction block is non-spherical.

28. A method of assembling a lighting panel, comprising:
providing a light source including an OLED panel;
optically coupling a light extraction block including at least one three dimensional light emitting surface to the light source,
wherein, the at least one three-dimensional light emitting surface includes a substantially curved surface,
wherein, at least one of,
(a) a first radius of curvature corresponding to a maximum principal curvature k1 at a point p located at the apex of the light extraction block and on the at least one substantially curved surface, wherein the first radius of curvature is greater than a maximum height of the light extraction block and a second radius of curvature corresponding to a minimum principal curvature k2 at the point p that is different from the first radius of curvature, and
(b) a maximum height of the light extraction block is less than 50% of a maximum width of the light extraction block; and
wherein the light extraction block is non-spherical.

29. The lighting panel of claim 1, wherein the maximum height of the light extraction block is at least 15 mm.

30. The lighting panel of claim 1, wherein the light extraction block is configured to improve illumination at angles away from the surface normal in accordance with Snell's law.

* * * * *